United States Patent
Tsai et al.

[19]

[11] Patent Number: 6,099,386
[45] Date of Patent: Aug. 8, 2000

[54] CONTROL DEVICE FOR MAINTAINING A CHEMICAL MECHANICAL POLISHING MACHINE IN A WET MODE

[75] Inventors: Pei-Wei Tsai; Huan-Jen Tseng, both of Chu-Pei; Chih-Hsien Chang, Taipei Hsien; Yi-Hua Chin, Taipei, all of Taiwan

[73] Assignee: Mosel Vitelic Inc., Hsin-Chu, Taiwan

[21] Appl. No.: 09/340,404

[22] Filed: Jun. 28, 1999

[30] Foreign Application Priority Data

Mar. 4, 1999 [TW] Taiwan ................................ 88103338

[51] Int. Cl.[7] .................................................. B24B 29/00
[52] U.S. Cl. ................................. 451/8; 451/5; 451/36; 451/285; 451/287
[58] Field of Search .............................. 451/41, 285, 287, 451/288, 36, 5, 8, 446

[56] References Cited

U.S. PATENT DOCUMENTS

| | | | |
|---|---|---|---|
| 5,659,492 | 8/1997 | Li et al. | 451/41 |
| 5,709,593 | 1/1998 | Guthrie et al. | 451/446 |
| 5,762,537 | 6/1998 | Sandhu et al. | 451/446 |
| 5,791,970 | 8/1998 | Yueh | 451/446 |
| 5,857,893 | 1/1999 | Olsen et al. | 451/466 |

*Primary Examiner*—Eileen P. Morgan
*Attorney, Agent, or Firm*—Winston Hsu

[57] ABSTRACT

The present invention provides a control device for maintaining a chemical mechanical polishing (CMP) machine in a wet mode, the CMP machine comprising a polishing pad, a slurry sprinkler for sprinkling liquid or deionized water, and at least one carrier head, the control device comprising a sensor positioned on the CMP machine for sensing the operational status of the slurry sprinkler and generating a corresponding sensing signal; and a control unit electrically connected to the sensor for measuring the time period over which the slurry sprinkler is closed wherein when the measured time period exceeds a predetermined length, the control unit will either send a warning signal or turn on the slurry sprinkler to sprinkle liquid onto the polishing pad according to a predetermined process so as to maintain the polishing pad in a wet mode.

5 Claims, 2 Drawing Sheets

CONTROL DEVICE FOR MAINTAINING A CHEMICAL MECHANICAL POLISHING MACHINE IN A WET MODE

BACKGROUND OF THE INVENTION

1. Field of the Invention

The present invention relates to a control device, and more particularly to a control device for maintaining a chemical mechanical polishing machine in a wet mode.

2. Description of the Prior Art

In semiconductor processing, protuberances of the deposited layer on the semiconductor wafer must be removed and unevenness of the semiconductor wafer must be eliminated through the execution of a planarization process. At the present time, chemical mechanical polishing (CMP) is the most widely performed global planarization method used in which a semiconductor wafer undergoes mechanical contact polishing on a CMP machine by sprinkling a chemical reagent onto the wafer and causing a particular chemical reaction. This increases the polishing rate.

Please refer to FIG. 1 and FIG. 2. FIG. 1 is a top view of the chemical mechanical polishing machine 10 according to the prior art. FIG. 2 is a sectional schematic diagram along line 2—2 of the chemical mechanical polishing machine 10 shown in FIG. 1. The CMP machine 10 comprises a polishing table 12, a polishing pad 14 positioned on the polishing table 12, a slurry sprinkler 16 for sprinkling liquid onto the polishing pad 14, and at least one carrier head 18. The carrier head 18 supports a semiconductor wafer 20 as it brings the semiconductor wafer 20 in contact with the polishing pad 14 where the CMP process takes place.

The liquid sprinkled from the slurry sprinkler 16 is a chemical agent formed from a mixture of colloidal silica or dispersive alumina with alkaline potassium hydroxide (KOH) or ammonia ($NH_4OH$) solution. The liquid comprises large quantities of hard polishing particles with a particle size distribution around 0.1 to 2.0 um. The chemical characteristics of this liquid and the highly abrasive particles are employed during the CMP process. Further adjustment of process parameters such as the temperature of the slurry, the rate of feeding or the polishing rate and matching of the material of the polish pad 14 is accomplished, the CMP process can be then performed to even out the semiconductor wafer 20 through chemical removal.

However, if the CMP machine 10 is not continuously maintained in a wet mode after the CMP process is completed, the residual liquid may dry on the polishing pad 14 and the carrier head 18 or even solidify within the pipeline of the slurry sprinkler 16. This would result in clogging of the pipeline. Later, when performing the CMP process again, this solidified liquid debris might be released from the slurry sprinkler and become distributed onto the CMP machine 10 to cause scraping of the surface of the semiconductor wafer 20. Also, the semiconductor wafer 20 may get caught on the carrier head 18 and become damaged or even crack as a result.

SUMMARY OF THE INVENTION

It is therefore a primary objective of the present invention to provide a control device for maintaining a CMP mechanical polishing machine in a wet mode to prevent degradation of the CMP process from dried up residual liquid.

In a preferred embodiment, the present invention provides a control device for maintaining a CMP machine in a wet mode, the CMP machine comprising a polishing pad, a slurry sprinkler for sprinkling liquid on the polishing pad, and at least one carrier head for holding a semiconductor wafer and bringing the semiconductor wafer in contact with the polishing pad for performing a CMP process, the control device comprising:

- a sensor for sensing the opening and closing of the slurry sprinkler and generating a corresponding sensing signal; and
- a control unit electrically connected to the sensor for measuring the time period over which the slurry sprinkler is closed wherein when the measured time period exceeds a predetermined length, the control unit will either send a warning signal or turn on the slurry sprinkler to sprinkle liquid onto the polishing pad according to a predetermined process so as to maintain the polishing pad in a wet mode.

It is an advantage of the present invention that the control device can control the operation of the slurry sprinkler to sprinkle liquid onto the polishing pad so as to maintain the polishing pad in a wet mode.

This and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
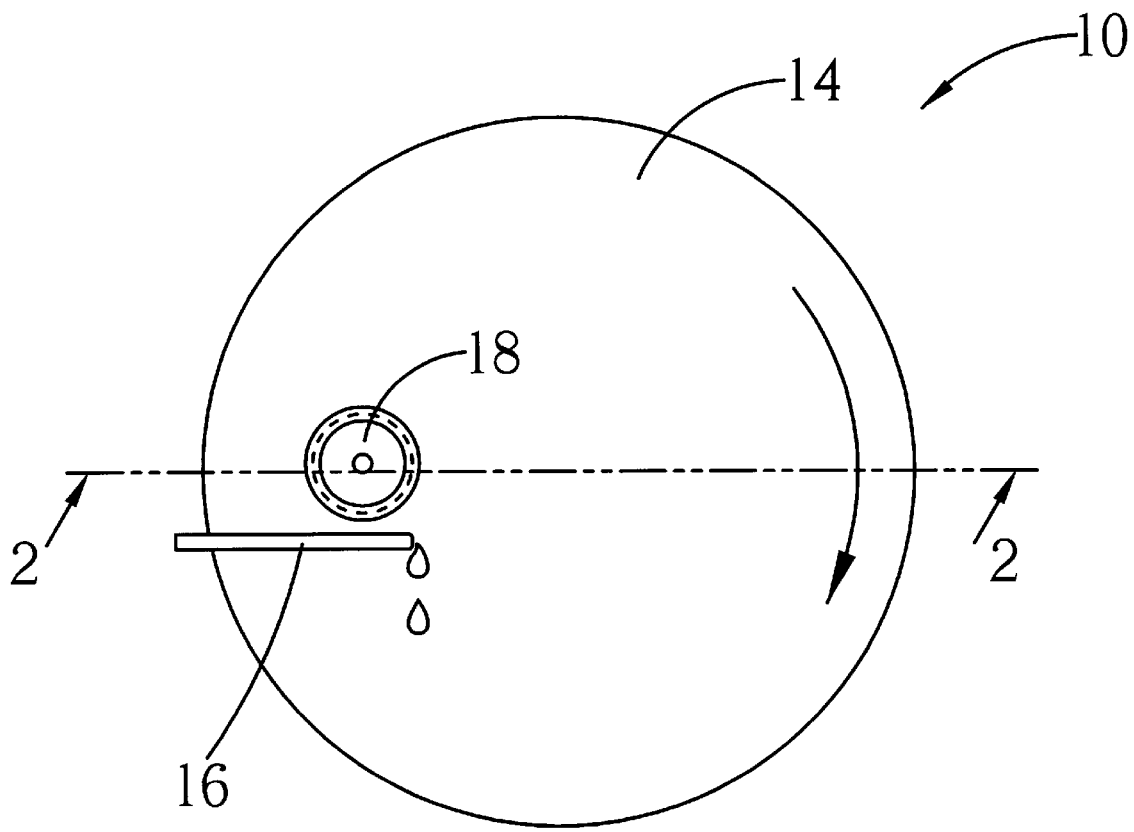
FIG. 1 is a top view of the chemical mechanical polishing machine 10 according to the prior art.
Figure 2:
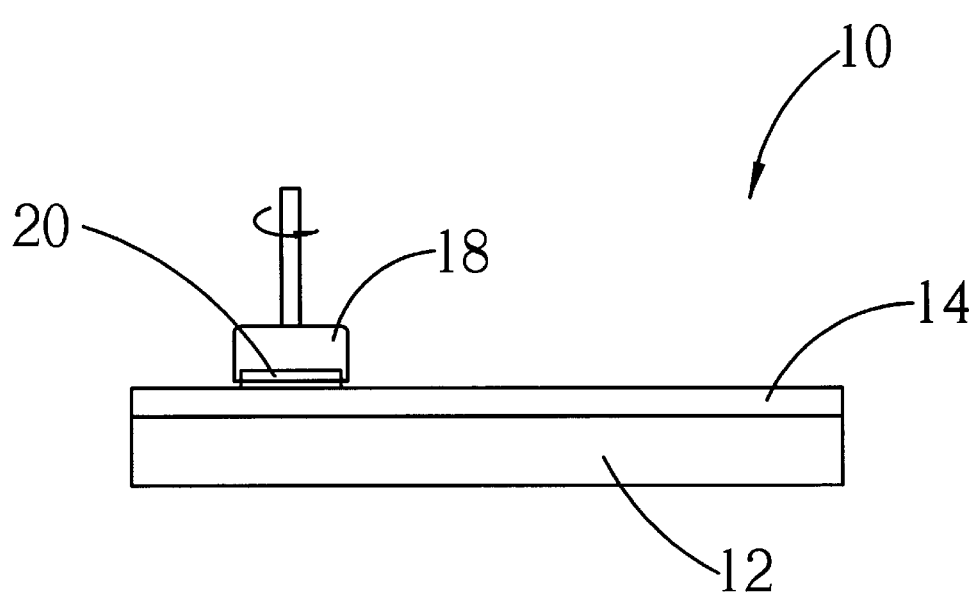
FIG. 2 is a sectional schematic diagram along line 2—2 of the CMP machine 10 shown in FIG. 1.
Figure 3:
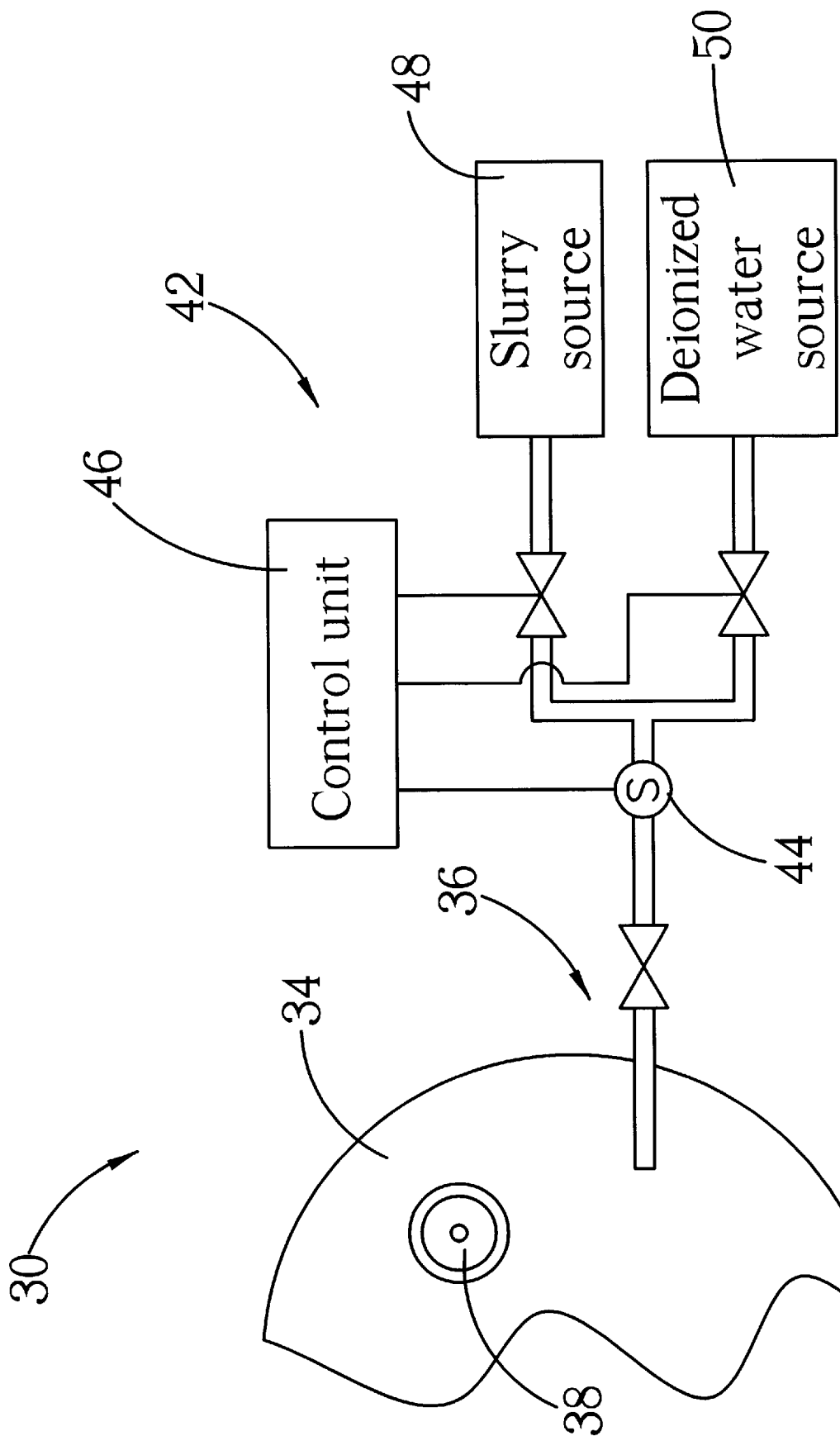
FIG. 3 is a schematic diagram of a control device 42 utilized in a CMP machine 30 according to the present invention.

Please refer to FIG. 3. FIG. 3 is a schematic diagram of a control device 42 utilized in a CMP machine 30 according to the present invention. A CMP machine 30 comprises a polishing table (not shown), a polishing pad 34 positioned on the polishing table, a slurry sprinkler 36 for sprinkling liquid onto the polishing pad, and at least one carrier head 38. The carrier head 38 comprises a layer of teflon film coated on its bottom side and functions to support a semiconductor wafer while bringing it in contact with the polishing pad 34 for CMP processing.

The control device 42 is positioned on the CMP machine 30 and connected with the slurry sprinkler 36 and between a slurry source 48 and a deionized water source 50. The control device maintains the CMP machine 30 in a wet mode. The control device 42 comprises a control unit 46 electrically connected to a sensor 44. The sensor 44 senses the operational status of the slurry sprinkler 36 and generates a corresponding sensing signal. The control unit 46 measures the time period over which the slurry sprinkler 36 is turned off and sends a warning signal when the measured time period exceeds a predetermined length.

In the CMP process performed on the CMP machine 30, the control unit 46 turns the slurry sprinkler 36 on to sprinkle liquid at a predetermined rate. The sensor 44 senses the operational status of the slurry sprinkler 36 and the volume of the sprinkled liquid and uses this data to generate a corresponding sensing signal for the control unit 46. When the slurry sprinkler 36 is off or the volume of the sprinkled liquid is insufficient, the control unit 46 turns on the slurry source 48 and the slurry sprinkler 36 after receiving the sensing signal generated from the sensor 44 causing the slurry sprinkler 36 to sprinkle a fixed volume of liquid. This maintains the CMP machine 30 in a wet mode.

While the CMP machine 30 is on standby, the sensor 44 of the control device 42 still senses whether the slurry sprinkler 36 is on or off and generates a corresponding sensing signal. The control unit 46 measures the length of time the sprinkler 36 is off. Once this measured time period exceeds a predetermined length, the control unit 46 emits a warning signal to alert the technician. Alternatively, the control unit may turn on the deionized water source 50 and the slurry sprinkler 36 itself to sprinkle deionized water onto the polishing pad 34 according to a predetermined process so as to moisturize the polishing pad 34 and the carrier head 38.

In summary, whether the CMP machine 30 performs the CMP process or is on standby, the sensor 44 continuously monitors the operational status of the slurry sprinkler 36 to generate a corresponding sensing signal for the control unit 46. The slurry sprinkler 36 turns on and off as needed to sprinkle liquid or deionized water to maintain moisture on the CMP machine 30. In this way, the residual liquid does not dry on the polishing pad 34 or the carrier head 38 and does not solidify in the pipeline of the slurry sprinkler 36. CMP processing is thus improved.

Compared to the prior art, the control device 42 is positioned on the CMP machine 30 of the present invention. The sensor 44 senses the operational status of the slurry sprinkler 36 and generates a corresponding sensing signal for the control unit 46. The control unit 46 then turns the slurry sprinkler 36 on or off accordingly. Whether the CMP machine 30 is performing CMP or is on standby, the polishing pad 34 and the carrier head 38 are maintained in a wet mode.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A control device for maintaining a CMP (chemical mechanical polishing) machine in a wet mode, the CMP machine comprising a polishing pad, a slurry sprinkler for sprinkling liquid on the polishing pad, and at least one carrier head for holding a semiconductor wafer and bringing the semiconductor wafer in contact with the polishing pad for performing a CMP process, the control device comprising:

a sensor for sensing the opening and closing of the slurry sprinkler and generating a corresponding sensing signal; and a control unit electrically connected to the sensor for measuring a time period over which the slurry sprinkler is closed wherein when the measured time period exceeds a predetermined length, the control unit will either send a warning signal or turn on the slurry sprinkler to sprinkle liquid onto the polishing pad according to a predetermined process so as to maintain the polishing pad in a wet mode.

2. The control device of claim 1 wherein the liquid sprinkled from the slurry sprinkler is deionized water for rinsing the polishing pad and the carrier head.

3. The control device of claim 2 wherein the control unit sprinkles deionized water onto the polishing pad to keep the polishing pad in a wet mode according to the predetermined process.

4. The control device of claim 1 wherein the carrier head comprises a layer of teflon film coated on its bottom side.

5. The control device of claim 1 wherein the liquid sprinkled from the slurry sprinkler is slurry for polishing the semiconductor wafer.

* * * * *